US009244110B2

(12) United States Patent
Ward

(10) Patent No.: US 9,244,110 B2
(45) Date of Patent: Jan. 26, 2016

(54) LEAKAGE CURRENT DETECTOR FOR AC AND DC SYSTEMS

(71) Applicant: Atreus Enterprises Limited, Ballinasloe (IE)

(72) Inventor: Patrick Ward, Ballinasloe (IE)

(73) Assignee: Atreus Enterprises Limited, Ballinasloe (IE)

( * ) Notice: Subject to any disclaimer, the term of this patent is extended or adjusted under 35 U.S.C. 154(b) by 190 days.

(21) Appl. No.: 13/718,080

(22) Filed: Dec. 18, 2012

(65) Prior Publication Data

US 2013/0221975 A1 Aug. 29, 2013

(30) Foreign Application Priority Data

Feb. 27, 2012 (IE) .................................. S2012/0101

(51) Int. Cl.
*G01R 31/02* (2006.01)
*H02H 3/33* (2006.01)
*G01R 19/10* (2006.01)

(52) U.S. Cl.
CPC .............. *G01R 31/025* (2013.01); *H02H 3/33* (2013.01); *H02H 3/332* (2013.01); *G01R 19/10* (2013.01)

(58) Field of Classification Search
CPC ...... G01R 31/025; G01R 19/10; G01R 31/14; G01R 31/327; G01R 31/42; G01R 35/00; G01R 31/02–31/07; G01R 19/15; H02H 3/32–3/338
USPC ......... 324/424, 508, 509, 541, 544, 551, 127; 361/42, 44–46
See application file for complete search history.

(56) References Cited

U.S. PATENT DOCUMENTS

| 3,187,225 | A  | * | 6/1965  | Mayer .................... H02H 1/063 361/65 |
| 3,535,590 | A  | * | 10/1970 | Mayer .................... H01H 39/00 335/171 |
| 4,851,761 | A  | * | 7/1989  | Matsuno .............. G01R 31/025 324/509 |
| 4,931,894 | A  |   | 6/1990  | Legatti |
| 5,223,789 | A  |   | 6/1993  | Katsuyama et al. |
| 6,262,871 | B1 | * | 7/2001  | Nemir et al. ..................... 361/42 |
| 6,721,151 | B2 | * | 4/2004  | Goto et al. ....................... 361/42 |
| 7,684,162 | B2 | * | 3/2010  | Musat et al. .................... 361/42 |
| 8,384,392 | B2 | * | 2/2013  | Lewinski et al. ............. 324/509 |
| 2004/0136125 | A1 | * | 7/2004 | Nemir et al. ..................... 361/42 |
| 2005/0212505 | A1 | * | 9/2005 | Murray et al. ................ 324/126 |
| 2007/0262779 | A1 | * | 11/2007 | Kirk ............................. 324/439 |
| 2008/0080106 | A1 | * | 4/2008  | Mirafzal ................. H02M 1/12 361/42 |

(Continued)

FOREIGN PATENT DOCUMENTS

| EP | 2568494 A2 | 3/2013 |
| WO | 2012/038478 A1 | 3/2012 |

OTHER PUBLICATIONS

European Search Report for European Patent Application No. EP12196107, mailed on Jun. 21, 2013, 5 pages.

*Primary Examiner* — Huy Q Phan
*Assistant Examiner* — James Split
(74) *Attorney, Agent, or Firm* — Withrow & Terranova, P.L.L.C.

(57) ABSTRACT

A leakage current detector for an electricity supply comprising a plurality of supply conductors supplying a load, the leakage detector comprising a connection from each supply conductor to a common conductor, a circuit for detecting a differential current flowing in the connections, and a circuit arranged to provide an output signal when the differential current reaches a predetermined magnitude.

17 Claims, 3 Drawing Sheets

(56) References Cited

U.S. PATENT DOCUMENTS

2009/0063064 A1* 3/2009 Jackson .................... 702/58
2010/0102823 A1* 4/2010 Knab et al. .................... 324/500
2013/0088240 A1* 4/2013 Hofheinz ............... G01R 27/18
  324/509

* cited by examiner

LEAKAGE CURRENT DETECTOR FOR AC AND DC SYSTEMS

This application claims priority to Irish national application number S2012/0101 filed Feb. 27, 2012, the disclosure of which is incorporated herein by reference in its entirety.

BACKGROUND

Residual current devices (RCDs) are widely used for the detection of differential or residual currents flowing in AC and DC systems. These will be familiar to those versed in the art, and examples of such devices are given in International Application No. PCT/EP2011/066450, which is incorporated herein by reference in its entirety.

RCDs tend to operate at current levels starting at several milliamperes, but typically not less than 5 mA. However leakage current detectors are generally required to operate at lower current levels, making the use of RCDs impractical for this application.

The principle of operation of leakage current detectors is well known to those versed in the art, and an example of such a device is given in U.S. Pat. No. 4,931,894, the disclosure of which is incorporated herein by reference in its entirety. Whilst the detection of leakage currents on AC systems is relatively simple, this is not the case for DC systems, especially a floating DC system as found in photovoltaic systems and electric vehicles.

SUMMARY

It is an object of the invention to provide an improved leakage detector whose principles can be applied to either AC or DC systems.

According to the present invention there is provided a leakage current detector for an electricity supply comprising a plurality of supply conductors supplying a load, the leakage detector comprising a connection from each supply conductor to a common conductor, means for detecting a differential current flowing in the connections, and a circuit arranged to provide an output signal when the differential current reaches a predetermined magnitude.

The invention differs from conventional leakage current detectors that use a current transformer (CT) for leakage current detection in the following way. In the latter it is generally the normal state that no current flows in the leakage detection circuit until an insulation breakdown occurs. Under a fault condition the resultant leakage current is detected. In the present invention there are two cancelling currents flowing through a CT to a common conductor under normal conditions, and a reduction in either current arising from an insulation breakdown is detected. This is a key departure from the prior art.

Each connection preferably includes a respective impedance, such as a resistor, to limit the current drawn from the supply conductors in both leakage and non-leakage conditions. Most preferably the impedances are substantially equal in value so that the circuit is equally sensitive to leakage faults between either supply conductor and the common conductor.

In certain embodiments the means for detecting a differential current comprises a current transformer, each connection forming a respective primary winding of the current transformer, the current transformer having at least one secondary winding.

In such embodiments each primary winding may comprise multiple turns, and most preferably substantially the same number of turns.

The invention is applicable to both AC and DC supplies.

Where the electricity supply is DC, the detecting circuit may include means for imposing an oscillatory signal on the secondary winding(s) to facilitate the detection of a non-zero vector sum of DC currents in the connections.

In other embodiments the detecting circuit may include a Hall Effect current sensor.

Preferably the leakage detector further includes a set of normally-closed contacts in the supply to the load, and an actuator arranged to open the contacts in response to said output signal.

The leakage detector is especially useful in systems in which the common conductor is a floating earth.

BRIEF DESCRIPTION OF THE DRAWINGS

Embodiments of the invention will now be described, by way of example, with reference to the accompanying drawings, in which.

DETAILED DESCRIPTION

Figure 1:
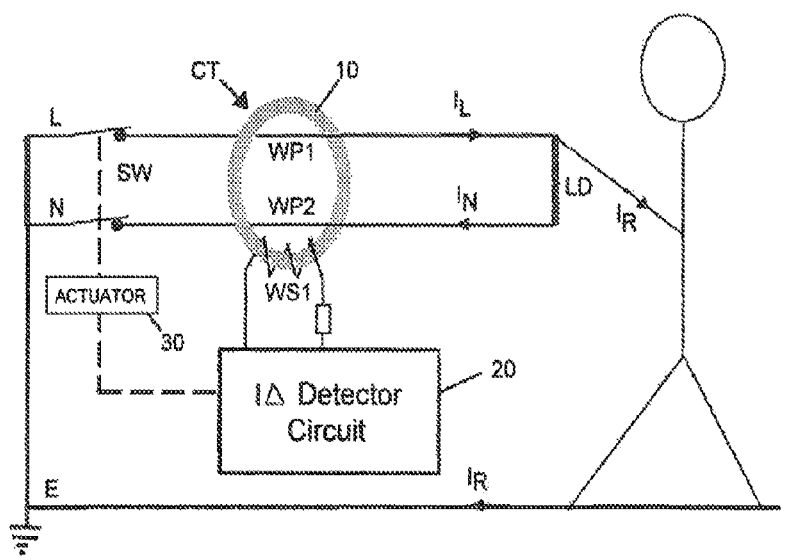
FIG. 1 is a circuit diagram of a known type of residual current device.

FIG. 1 is an example of a typical RCD circuit for the detection of AC residual currents. The operation of such RCDs is well-known so only a brief description will be given.

A single phase AC mains supply to a load LD comprises live L and neutral N conductors which pass through a toroidal ferromagnetic core 10 of a current transformer CT. The conductors L, N serve as primary windings WP1 and WP2 of the current transformer CT and a winding WS1 on the core serves as a secondary winding. In relation to the primary conductors, the term "winding" is used in accordance with conventional terminology, even though these conductors pass directly through the core rather than being wound on it.

The currents $I_L$ and $I_N$ in the live and neutral conductors L, N flow in opposite directions through the core 10. Thus, under normal conditions, the vector sum of the primary currents $I_L$ and $I_N$ is zero in the absence of a residual (earth fault) current $I_R$ caused by, for example, a person touching the live conductor L. However, the presence of a residual current $I_R$ leads to a differential current IΔ in the primaries WP1 and WP2, i.e. a non-zero vector sum of the primary currents $I_L$ and $I_N$, which induces a mains frequency current in the secondary winding WS1.

The output of the secondary winding WS1 is fed to a differential current detector circuit 20. The circuit 20 may be a WA050 RCD integrated circuit (IC) powered from the mains supply (the connections to the mains supply are not shown). The IC 20 is an industry standard RCD IC supplied by Western Automation Research & Development Ltd, Ireland. If IΔ exceeds the operating threshold of the IC 20, the IC 20 will produce an output signal which will cause an actuator 30 to open ganged switch contacts SW in the live and neutral conductors L, N to disconnect the mains supply. The actuator 30 typically comprises a solenoid-based electromechanical switch, such as a relay, and associated switching circuitry, the current flow through the solenoid either being increased to above a threshold, or reduced to below a threshold, to open the contacts SW, depending on the type of circuit. This is well known.

It is worth noting that the fault condition in this case creates a differential current that is in addition to the normal load current, with a resultant increase in the currents flowing through the CT core, and it is the increased current flow in one conductor that is detected.

Figure 2:
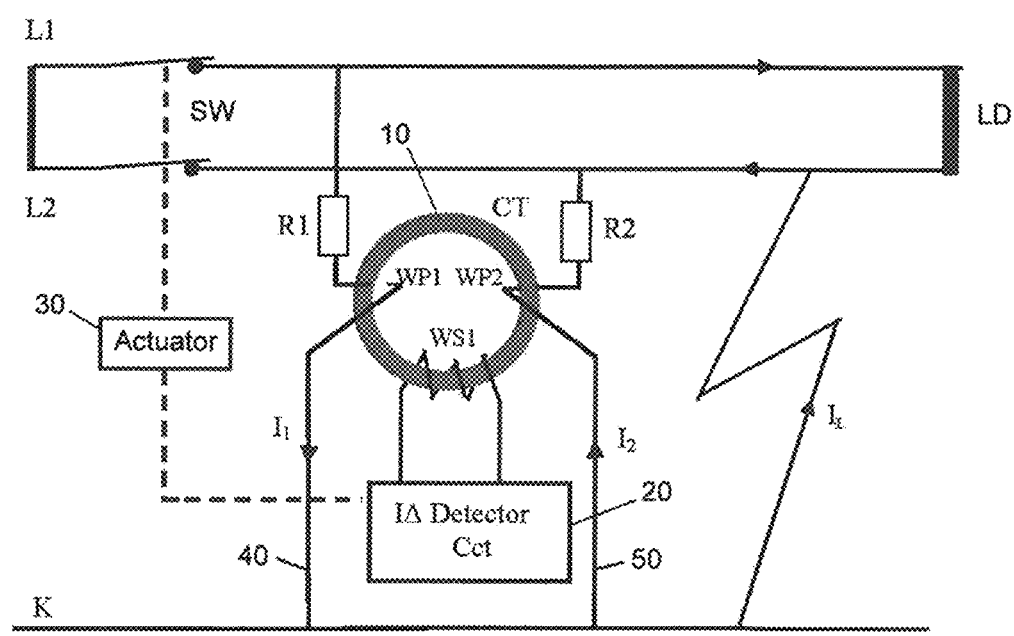
FIG. 2 is a circuit diagram of a first embodiment of the invention designed for use with AC systems.

FIG. 2 shows how the basic current transformer principle of operation can be adapted for the detection of a leakage current.

In the arrangement of FIG. 2, an AC supply comprising conductors L1 and L2 supplies a load LD. The AC supply is floating or independent of the earth, for example as in an IT system. Conductor K represents a conductive part, e.g. a metallic frame of an electric vehicle, and is referred to as a floating earth. A first connection 40 including a series resistor R1 is made from supply conductor L1 to K passing through the CT core 10 to form a first primary winding WP1. A second connection 50 including a series resistor R2 is made from supply conductor L2 to K passing through the CT core 10 to form a second primary-winding WP2. The resistors R1 and R2 are preferably equal in value, and have a high resistance as discussed below. A current I1 will flow from L1 to K and return to L2 as I2, both currents flowing within the CT core 10. It is preferably arranged for WP1 and WP2 to have the same number of turns so that, with the two primary currents I1 and I2 being of equal amplitude in the absence of a leak from either one of L1 and L2 to K, and, since they flow in opposite directions through the CT core, the output of the secondary winding WS1 will be negligible in normal conditions.

In the event of an insulation breakdown from L2 to K as shown by the zigzag line, a leakage current $I_L$ will flow outside the CT core 10. This new current path will be in parallel to that of I2 with the result that I1 will now preferably return to L2 via the fault path rather than via R2 with the result that I2 will effectively be reduced in magnitude. Thus if the insulation breakdown was of negligible impedance, I2 would fall to a negligible value. In any event, the CT will now see a differential current IΔ by virtue of the reduction in the value of I2 and will produce an output from WS1 to the detector circuit 20, and if the differential current is above a predetermined threshold, the contacts SW will be opened automatically as in the case of FIG. 1.

The outcome will be the same if a similar insulation breakdown occurs from L1 to K. Thus, the circuit of FIG. 2 can be used to detect a leakage current from either side of an AC supply.

Figure 3:
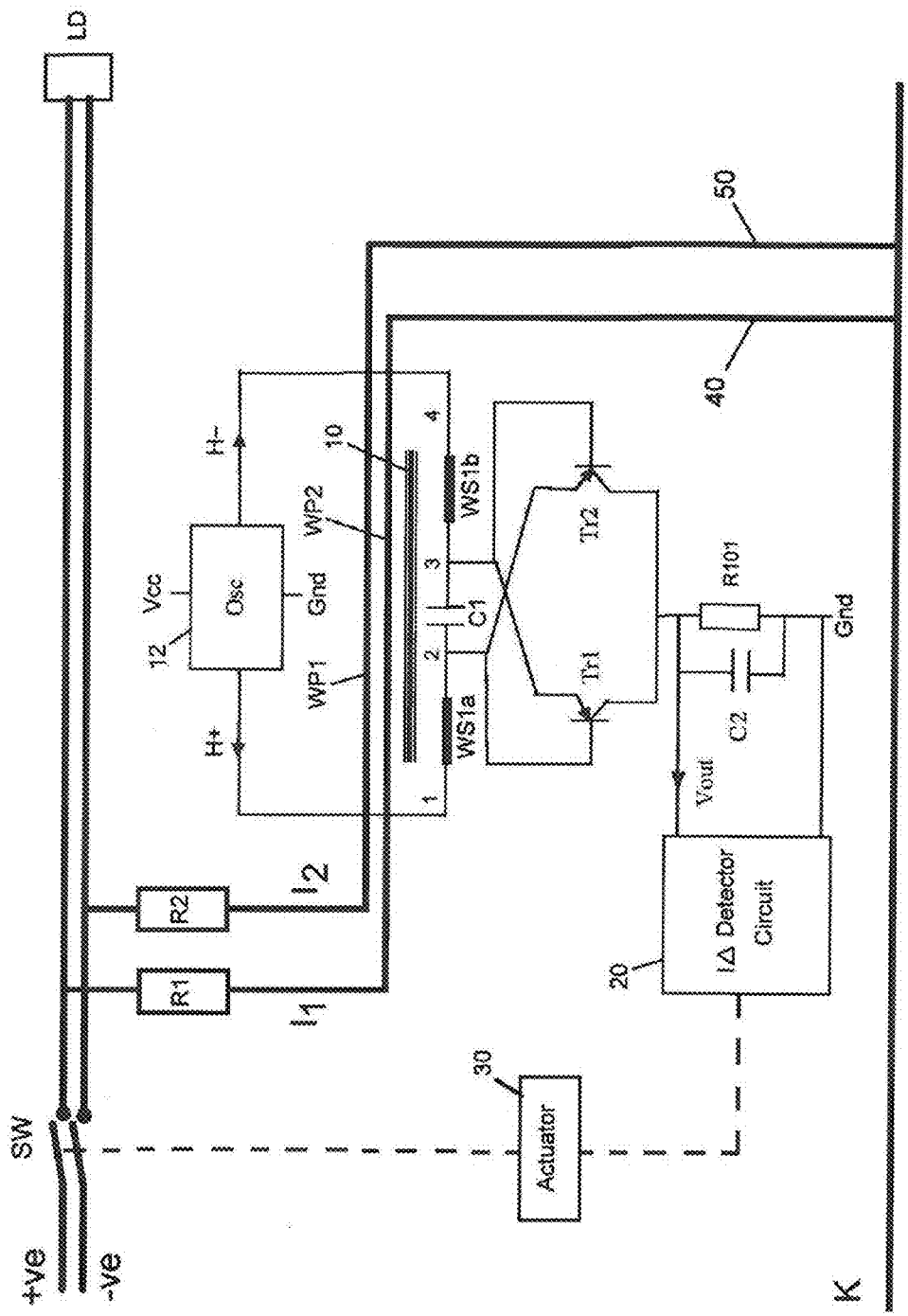
FIG. 3 is a circuit diagram of a second embodiment of the invention designed for use with DC systems.

FIG. 3 shows how the principle described above can be applied for detection of a DC leakage current.

In the arrangement of FIG. 3 a DC supply system feeds a load LD, and as before there are connections 40, 50 from each supply conductor to K via a respective resistor R1 or R2. Each connection passes through the core 10 as a primary winding WP1 or WP2 (the core 10 is shown in schematic form in FIG. 3). In this case the currents I1 and I2 which flow in the CT primary windings WP1 and WP2 respectively are DC currents. Under normal conditions the currents I1 and I2 are equal in magnitude and opposite in direction as they pass through the core 10, so that their vector sum is negligible and no differential current will be produced. However, if there is a leakage current from either the +ve or −ve supply conductor to K a differential current will be produced within the CT. Since this differential current is DC it cannot of itself induce a signal into the secondary WS1, so a more sophisticated arrangement is necessary. The detection technique used is based on the principles described in Patent Application PCT/EP2011/066450, so only a brief summary will be given here.

In FIG. 3 the previous single secondary winding WS1 has now been replaced by two secondary windings, WS1a and WS1b. The detector circuit 20 is connected between the supply conductors +ve and −ve, with −ve being referred to as ground for convenience. The start and finish of windings WS1a and WS1b are designated 1 and 4 respectively, and these two points are connected to an oscillator circuit I2, the other ends being coupled together via a capacitor C1. These components form a loop or a first circuit for current flow from Vcc to ground. A second circuit to ground is formed by transistors Tr1, Tr2, a resistor R101 and a capacitor C2. The oscillator current as represented by H+ and H− will initially flow back and forth through WS1a, C1 and WS1b at the oscillator frequency F, which will typically be about 1 KHz. During the positive half cycles the Vcc supply of 15V will be distributed approximately as 15V, 7.5V, 7.5V and 0V at points 1, 2, 3 and 4 respectively, and during the negative half cycles Vcc will be distributed approximately as 0V, 7.5V, 7.5V and 15V at points 1, 2, 3 and 4 respectively. In the absence of any differential current flow in the primary conductors the differential voltage across C1 will be effectively zero. Under this condition, the oscillator current will flow entirely within the loop comprising of Osc 12, WS1a, C1 and WS1b. In the event of an insulation breakdown between the −ve DC supply conductor and K, $I_1$ will then be greater than $I_2$ because a portion of current that previously comprised $I_2$ will now flow through the insulation fault. In this case a net DC current +Idc will flow through the CT core 10 and the Osc 12 current will then have a DC offset with the result that C1 will start to charge up with this DC current. When point 2 reaches approximately 0.7V higher than point 3 during the oscillatory cycles, transistor Tr2 will start to conduct and the oscillatory current will flow to ground via resistor R101 and develop a voltage across R101. In the event of an insulation breakdown between the +ve DC supply conductor and K, $I_2$ will then be greater than $I_1$ because a portion of current that previously comprised $I_1$ will now flow through the insulation fault. In this case a net DC current −Idc will flow through the CT core 10 and the Osc 12 current will now have a DC offset with the result that C1 will start to charge up with this DC current. When point 3 reaches approximately 0.7V higher than point 2 during the oscillatory cycles, transistor Tr1 will conduct and the oscillatory current will flow to ground via resistor R101 and develop a voltage across R101.

The voltage across R101 will be smoothed by C1, and the DC voltage developed across R101 will be proportional to the net DC current flow within the CT core 10. This voltage can be measured by the detection circuit 20 and used to open the contacts SW as before. Thus in the case of FIG. 3, a net DC current flowing from either side of the DC supply to K due to an insulation breakdown will be detected by the circuitry.

In the arrangement of FIG. 1, the CT primary conductors are required to carry the full load current, and due to their requisite cross sectional area there will be a serious constraint on the number of primary turns that can be wound on the CT. However, in the arrangements of FIGS. 2 and 3, the CT primary conductors WP1 and WP2 need only carry a relatively small current, for example a few milliamperes, with a resultant reduction in their cross sectional area which in turn facilitates the winding of multiple primary turns on the CT. Thus with 100 turns for each primary, I1 and I2 values of 0.5 mA would be seen as 50 mAT within the CT. Although the vector sum of these two currents would be effectively zero under normal conditions, a short circuit from either supply conductor to K would result in a 50 mA differential current as seen by the CT. The use of multiple primary turns facilitates the use of a smaller primary current by suitable selection of high resistance values for R1 and R2, and also results in lower power dissipation in the overall circuit in both leakage and non-leakage conditions. The use of relatively high impedance values for R1 and R2 coupled with a relatively large number of turns in WP1 and WP2 also ensures that even a relatively high resistance insulation fault will result in the diversion of a sufficient portion of $I_1$ or $I_2$ external to the CT so as to facilitate easier detection of even a low level leakage current. By making R1 equal to E2, the circuit is equally sensitive to leakage faults between either supply conductor and conductor K.

The circuit of FIG. 2 could be a conventional AC system e.g. TN, TT or IT, with a floating conductor K provided within the system, e.g. the cable supplying a load being used to facilitate detection of a leakage current arising from an insulation failure. In an IT system K could be earth or a metallic frame.

The circuit of FIG. 3 could be a DC system as used in mines and tunnels and solar panel photovoltaic systems, with K being earth or a metallic part. It could also be representative of an electric vehicle, with K being the chassis or body of the vehicle.

Instead of using a current transformer CT to determine a differential current in the connections 40, 50 one could use a toroidal Hall Effect current sensor, the two connections 40, 50 being passed through the sensor which would then be able to detect a differential current.

It should be noted that in the event of failure of either connection 40 or 50, for example, a short or open circuit, the circuit will also trip if the resultant difference in the two primary currents is above the detection threshold of the device. In that sense, the device has a built-in "fail safe" feature.

Although the invention has been described in terms of embodiments where the mains supply has two supply conductors (L and N, or +ve and −ve) it is equally applicable to multi-phase AC having more than two supply conductors.

Refinements may be made to the various circuits without departing materially from the invention. The leakage current detector could be used to activate a visual or audible alarm instead of opening load contacts, etc.

The invention is not limited to the embodiments described herein which may be modified or varied without departing from the scope of the invention.

The invention claimed is:

1. A leakage current detector for a DC electricity supply comprising a plurality of supply conductors supplying a load, the leakage current detector comprising a connection from each supply conductor to a common conductor, a circuit for detecting a differential current flowing in the connections, and a circuit arranged to provide an output signal when the differential current reaches a predetermined magnitude wherein the detecting circuit includes a current transformer, each connection forming a respective primary winding of the current transformer, the current transformer having at least one secondary winding, and an oscillator for imposing an oscillatory signal on the secondary winding(s) to facilitate the detection of a non-zero vector sum of DC currents in the connections.

2. A leakage current detector according to claim 1 wherein each connection includes a respective impedance to limit the current drawn from the plurality of supply conductors in both leakage and non-leakage conditions.

3. A leakage current detector according to claim 2 wherein each impedance comprises a resistor.

4. A leakage current detector according to claim 2 wherein the impedances are substantially equal in value so that the circuit for detecting a differential current is equally sensitive to leakage faults between either supply conductor and the common conductor.

5. A leakage current detector according to claim 1 wherein each primary winding comprises multiple turns.

6. A leakage current detector according to claim 5 wherein each primary winding comprises substantially the same number of turns.

7. A leakage current detector according to claim 1 wherein the leakage current detector further includes a set of normally-closed contacts in the supply to the load, and an actuator arranged to open the contacts in response to said output signal.

8. A leakage current detector for an electricity supply comprising a plurality of supply conductors supplying a load, the leakage current detector comprising: a toroid, a permanent wired connection from each supply conductor to a common conductor, each permanent wired connection passing separately through the toroid, a circuit operably connected to the toroid for detecting a differential current resulting from the different currents flowing in the permanent wired connections in the event of a leakage current from one of said supply conductors to said common conductor, and a circuit arranged to provide an output signal when the differential current reaches a predetermined magnitude.

9. A leakage current detector according to claim 8 wherein each permanent wired connection includes a respective impedance to limit the current drawn from the plurality of supply conductors in both leakage and non-leakage conditions.

10. A leakage current detector according to claim 9 wherein each impedance comprises a resistor.

11. A leakage current detector according to claim 9 wherein the impedances are substantially equal in value so that the circuit for detecting a differential current is equally sensitive to leakage faults between either supply conductor and the common conductor.

12. A leakage current detector according to claim 8 wherein the detecting circuit includes a toroidal current transformer, each permanent wired connection forming a respective primary winding of the current transformer, the current transformer having at least one secondary winding.

13. A leakage current detector according to claim 12 wherein each primary winding comprises multiple turns.

14. A leakage current detector according to claim 13 wherein each primary winding comprises substantially the same number of turns.

15. A leakage current detector according to claim 12 arranged to operate with either an AC or a DC supply.

16. A leakage current detector according to claim 15, wherein the electricity supply is DC, said detecting circuit including an oscillator for imposing an oscillatory signal on the secondary winding(s) to facilitate the detection of a non-zero vector sum of DC currents in the permanent wired connections.

17. A leakage current detector according to claim 8 wherein the leakage current detector further includes a set of normally-closed contacts in the supply to the load, and an actuator arranged to open the contacts in response to said output signal.

* * * * *